(12) United States Patent
Huang et al.

(10) Patent No.: US 8,643,136 B2
(45) Date of Patent: Feb. 4, 2014

(54) HIGH VOLTAGE DEVICE AND MANUFACTURING METHOD THEREOF

(75) Inventors: Tsung-Yi Huang, Hsinchu (TW); Kuo-Hsuan Lo, Taoyuan (TW)

(73) Assignee: Richtek Technology Corporation, Chupei, Hsin-Chu (TW)

( * ) Notice: Subject to any disclaimer, the term of this patent is extended or adjusted under 35 U.S.C. 154(b) by 289 days.

(21) Appl. No.: 13/037,678

(22) Filed: Mar. 1, 2011

(65) Prior Publication Data

US 2012/0223384 A1    Sep. 6, 2012

(51) Int. Cl.
*H01L 21/336*  (2006.01)
*H01L 29/66*  (2006.01)
*H01L 21/02*  (2006.01)

(52) U.S. Cl.
USPC .... 257/492; 257/493; 257/409; 257/E21.345; 257/E21.418; 257/E29.012; 257/E29.021; 257/E29.066; 257/E29.027

(58) Field of Classification Search
USPC .................. 257/492, E29.063, E29.268, 409
See application file for complete search history.

(56) References Cited

U.S. PATENT DOCUMENTS

| | | | | |
|---|---|---|---|---|
| 6,835,993 B2 * | 12/2004 | Sridevan et al. | ............... | 257/492 |
| 7,821,082 B1 * | 10/2010 | Lin et al. | ........................ | 257/409 |
| 8,274,129 B2 * | 9/2012 | French et al. | .................. | 257/492 |
| 2002/0185705 A1 * | 12/2002 | Saitoh et al. | ................... | 257/492 |
| 2006/0267044 A1 * | 11/2006 | Yang | .............................. | 257/141 |
| 2010/0270615 A1 * | 10/2010 | Lin et al. | ........................ | 257/343 |

* cited by examiner

*Primary Examiner* — Zandra Smith
*Assistant Examiner* — Tsz Chiu
(74) *Attorney, Agent, or Firm* — Tung & Associates

(57) ABSTRACT

The present invention discloses a high voltage device and a manufacturing method thereof. The high voltage device includes: a first conductive type substrate in which isolation regions are formed for defining a device region; a gate formed on the first conductive type substrate; a source and a drain formed in the device region and located at both sides of the gate respectively, and doped with second conductive type impurities; a second conductive type well, which is formed in the first conductive type substrate, and surrounds the drain from top view; and a first deep trench isolation structure, which is formed in the first conductive type substrate, and is located in the second conductive type well between the source and the drain from top view, wherein the depth of the first deep trench isolation structure is deeper than the second conductive type well from the cross-sectional view.

5 Claims, 6 Drawing Sheets

HIGH VOLTAGE DEVICE AND MANUFACTURING METHOD THEREOF

BACKGROUND OF THE INVENTION

1. Field of Invention

The present invention relates to a high voltage device and a manufacturing method of a high voltage device; particularly, it relates to such device and manufacturing method wherein a deep trench isolation structure is provided between a source and a drain of the high voltage device to increase the breakdown voltage.

2. Description of Related Art

FIG. 1 shows a cross-section view of a prior art high voltage device. As shown in FIG. 1, isolation regions 12 are formed in a P-type substrate 11 to define a first device area 100 and a second device area 200. The isolation regions 12 for example are formed by local oxidation of silicon (LOCOS). A gate 13 is formed on the P-type substrate 11. In the first device area 100, an N-type source 14, a P-type body 16, and a P-type body region 17 are formed. In the second device area 200, an N-type drain 15 is formed. And, an N-type well 18 is formed between the source 14 and the drain 15. The high voltage device is usually coupled to a high voltage of tens to hundreds volts during operation; the higher the voltage (i.e., the breakdown voltage) that the high voltage device can sustain, the broader the application of the high voltage device is. To increase the breakdown voltage, a high electric field which is generated by the high voltage in the high voltage device needs to be decreased.

In view of the foregoing, the present invention provides a high voltage device and a manufacturing method of the high voltage device, in which the high electric field generated by a high voltage is decreased to increase the breakdown voltage and to broaden the application of the high voltage device.

SUMMARY OF THE INVENTION

The first objective of the present invention is to provide a high voltage device.

The second objective of the present invention is to provide a manufacturing method of a high voltage device.

To achieve the objectives mentioned above, from one perspective, the present invention provides a high voltage device including: a first conductive type substrate in which isolation regions are formed for defining a device region; a gate which is formed on the first conductive type substrate; a source and a drain, which are formed in the device region and located at both sides of the gate respectively, and are doped with second conductive type impurities; a second conductive type well, which is formed in the first conductive type substrate, and surrounds the drain from top view; and at least a first deep trench isolation structure, which is formed in the first conductive type substrate, and is located in the second conductive type well between the source and the drain from top view, wherein the first deep trench isolation structure has a depth deeper than the second conductive type well from cross-section view.

From another perspective, the present invention provides a manufacturing method of a high device, including: forming isolation regions for defining a device region in a first conductive type substrate; forming a gate on the first conductive type substrate; forming a source and a drain in the device region, at both sides of the gate respectively, wherein the source and the drain are doped with second conductive type impurities; forming a second conductive type well in the first conductive type substrate, which surrounds the drain from top view; and forming at least a first deep trench isolation structure, which is formed in the first conductive type substrate, and is located in the second conductive type well between the source and the drain from top view, wherein the first deep trench isolation structure has a depth deeper than the second conductive type well from cross-section view.

The aforementioned device preferably further includes a first surrounding region, which is doped with first conductive type impurities, and completely surrounds or is partially around the first deep trench isolation structure from top view, the first surrounding region being shallower than the second conductive type well from cross-section view.

The aforementioned device preferably further includes a body region, which surrounds the source from top view and cross-section view.

In one embodiment of the aforementioned device, one of the isolation regions is at least partially beneath the gate from cross-section view.

In one embodiment, the aforementioned device may further include a second deep trench isolation structure, which is formed outside and surrounding the device region.

The aforementioned device may further include a second surrounding region, which is doped with second conductive type impurities, and completely or partially surrounds the first surrounding region from top view, the second surrounding region being shallower than the second conductive type well from cross-section view The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, but not drawn according to actual scale.

Figure 1:
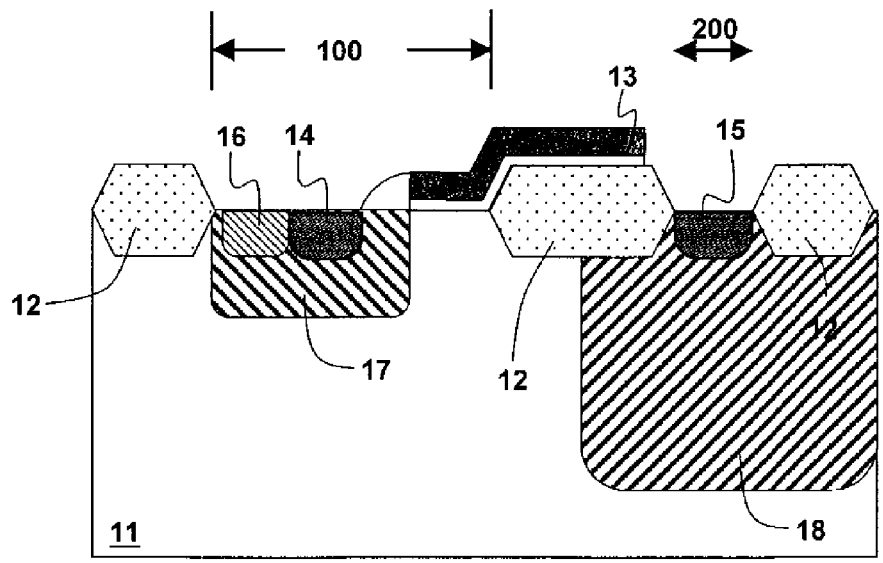
FIG. 1 shows cross-section view of a conventional high voltage device.
Figure 2A:
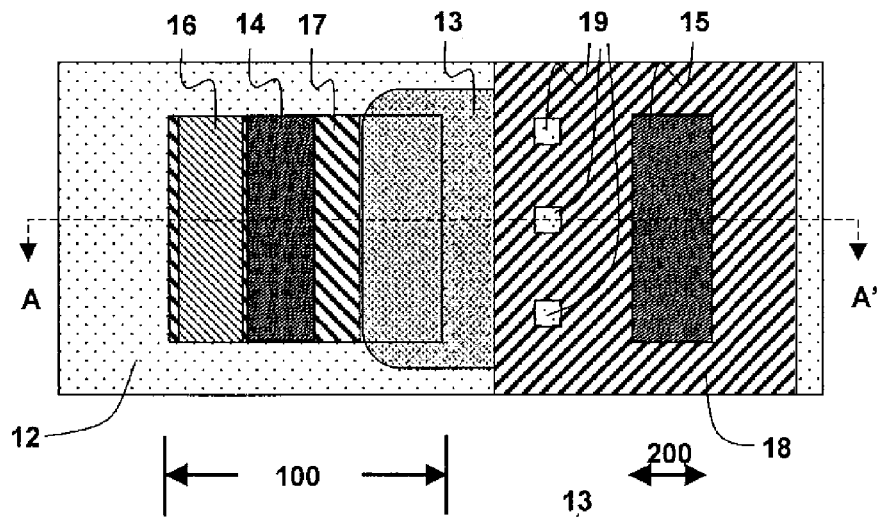
FIGS. 2A and 2B show a first embodiment of the present invention.
Figure 2B:
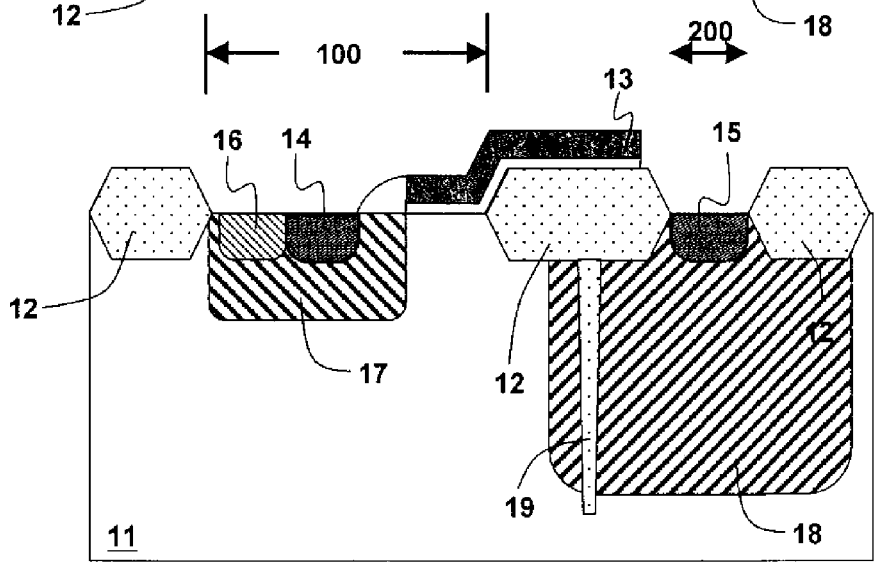

FIGS. 2A and 2B show a first embodiment of the present invention. FIG. 2A shows a top view of this embodiment, and FIG. 2B shows a cross-section view along the cross-section line AA' in FIG. 2A. First, isolation regions 12 are formed in a first conductive type substrate 11 to define a first device area 100 and a second device area 200. Then, a gate 13 is formed on the first conductive type substrate 11. Next, a second conductive type source 14, a first conductive type body 16, and a first conductive type body region 17 are formed in the first device area 100. A second conductive type drain 15 is formed in the second device area 200. A second conductive type well 18 is formed between the source 14 and the drain 15. This embodiment is characterized in that a first deep trench isolation structure 19 is formed in the substrate 1, at a proper timing in the manufacturing process such as before the isolation regions 12 are formed. From top view (FIG. 2A), the first deep trench isolation structure 19 is in the second conductive type well 18, and between the drain 14 and the source 15; from cross-section view (FIG. 2B), the first deep trench isolation structure 19 has a depth deeper than the second conductive type well 18. One of the isolation regions 12 is at least partially beneath the gate 13 from cross-section view (FIG. 2B). The body region 17 surrounds the source 14 from both top view (FIG. 2A) and cross-section view (FIG. 2B).

Figure 2C:
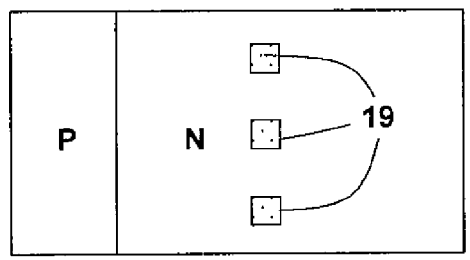
FIGS. 2C and 2D show how the electric field is decreased in the high voltage device of the first embodiment.
Figure 2D:
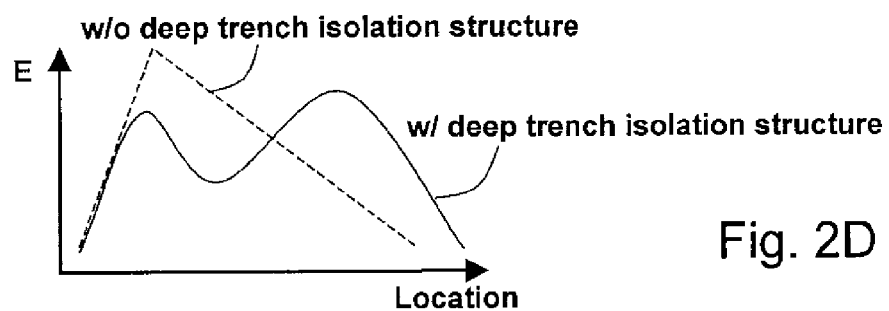

FIGS. 2C and 2D show how the first embodiment decreases the electric field in the device. As shown in FIG. 2C, the first deep trench isolation structure 19 is formed in a P-N junction, for example in the N-type region of the P-N junction, and the depth of the first deep trench isolation structure 19 is deeper than the N-type region. In a preferred embodiment, the first deep trench isolation structure 19 includes multiple segments which are arranged in an array perpendicular to the electronic field with a predetermined distance apart from each other. However, such arrangement is preferred but not necessary; that is, the multiple segments of the first deep trench isolation structure 19 do not have to be aligned in one line with equal distance apart from each other. FIG. 2D shows characteristic curves of the electric field at different locations in the P-N junction. As shown in the figure, the electric field of a P-N junction without the first deep trench isolation structure 19 presents a characteristic curve as indicated by the dash line, which has a local maximum near the junction. The electric field of a P-N junction with the first deep trench isolation structure 19 presents a characteristic curve as indicated by the solid line. As the comparison shows, the P-N junction with the first deep trench isolation structure 19 has an apparently lower electric field near the junction.

Figure 3A:
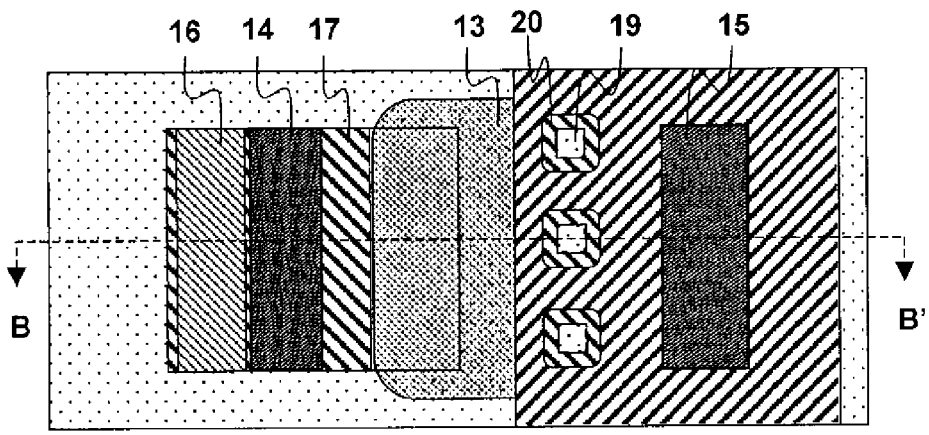
FIGS. 3A-3D show a second embodiment of the present invention.
Figure 3B:
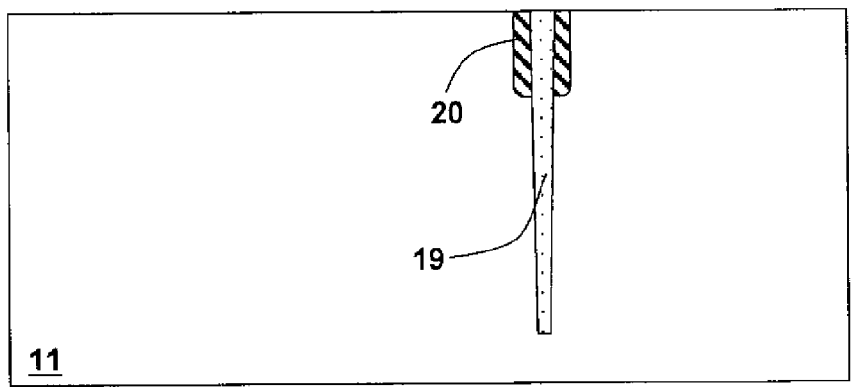
Figure 3C:
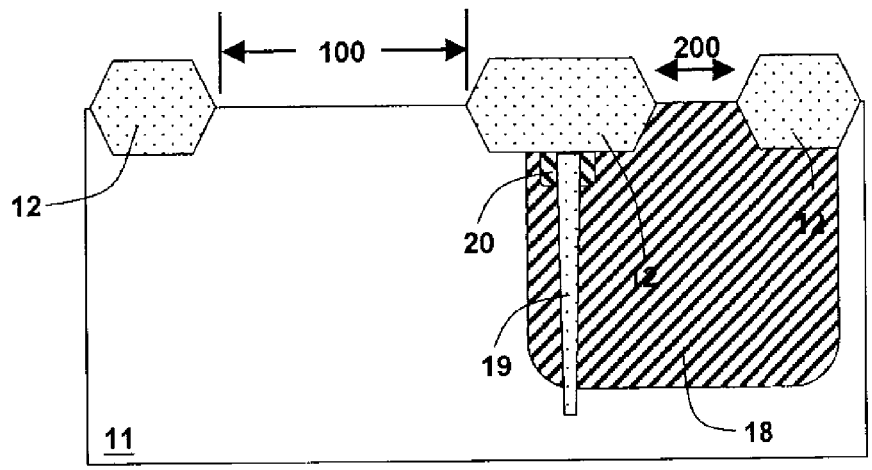
Figure 3D:
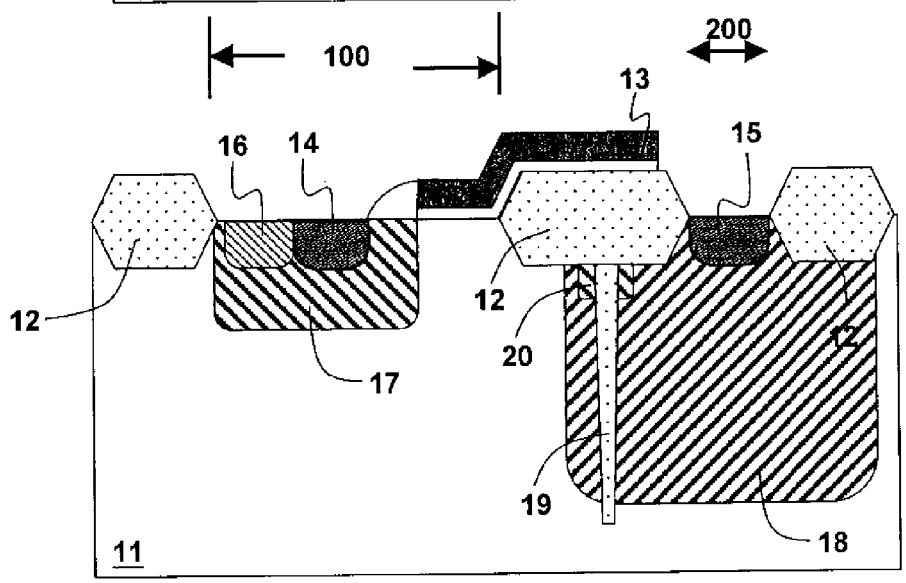

FIGS. 3A-3D show a second embodiment of the present invention. FIG. 3A is a schematic diagram showing a top view of this embodiment, and FIGS. 3B-3D are schematic diagrams showing the manufacturing process by cross-section views along the cross-section line BB' in FIG. 3A. Referring to FIG. 3A, this embodiment is different from the first embodiment in that a first surrounding region 20 doped with first conductive type impurities is formed surrounding at least one segment of the first deep trench isolation structure 19. From top view, the first surrounding region 20 may completely surround a corresponding segment of the first deep trench isolation structure 19 (as shown in FIG. 3A), or, the first surrounding region 20 may be partially around the corresponding segment of the first deep trench isolation structure 19 (for example, the first surrounding region 20 may be around a corresponding segment of the first deep trench isolation structure 19 at its upper side, lower side, or both upper and lower sides from top view). The first surrounding region 20 has a depth shallower than the second conductive type well 18.

Referring to FIGS. 3B-3D which are schematic cross-sectional diagrams showing the manufacturing process, first, a first conductive type substrate 11 is provided, which is for example but not limited to a P-type substrate, and the first surrounding region 20 and the first deep trench isolation structure 19 are formed in the P-type substrate 11. Next, as shown in FIG. 3C, isolation regions 12 are formed for defining the first device area 100 and device area 200, and the second conductive type well 18 is formed. The isolation regions 12 for example may be formed by LOCOS or shallow trench isolation (STI).

Next, referring to FIG. 3D, the gate 13 is formed on the substrate 11. Further next, the body region 17 and body 16 are formed in regions defined by lithography and the gate 13, by implantation which implants first conductive type impurities, such as P-type impurities, in the form of accelerated ions to the defined regions.

Next, the source 14 and drain 15 are formed in regions defined by lithography and the gate 13, by implantation which implants second conductive type impurities, such as N-type impurities, in the form of accelerated ions to the defined regions.

Figure 4:
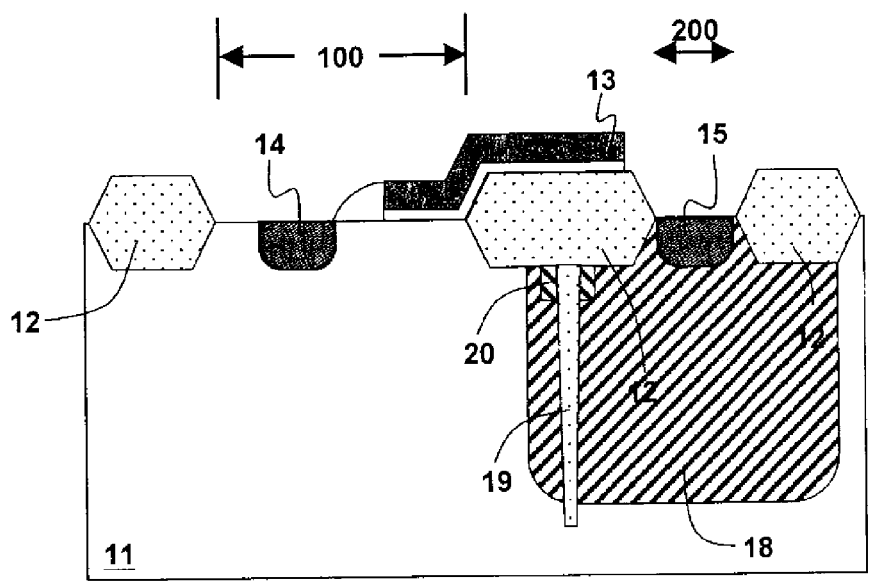
FIG. 4 shows a third embodiment of the present invention.

FIG. 4 shows a third embodiment of the present invention. In this embodiment, the present invention is applied to another type of high voltage device, which is a lateral double diffused metal oxide semiconductor (LDMOS) device as shown in the figure. Different from the first embodiment, in the LDMOS device of this embodiment, there is no body region 17.

Figure 5:
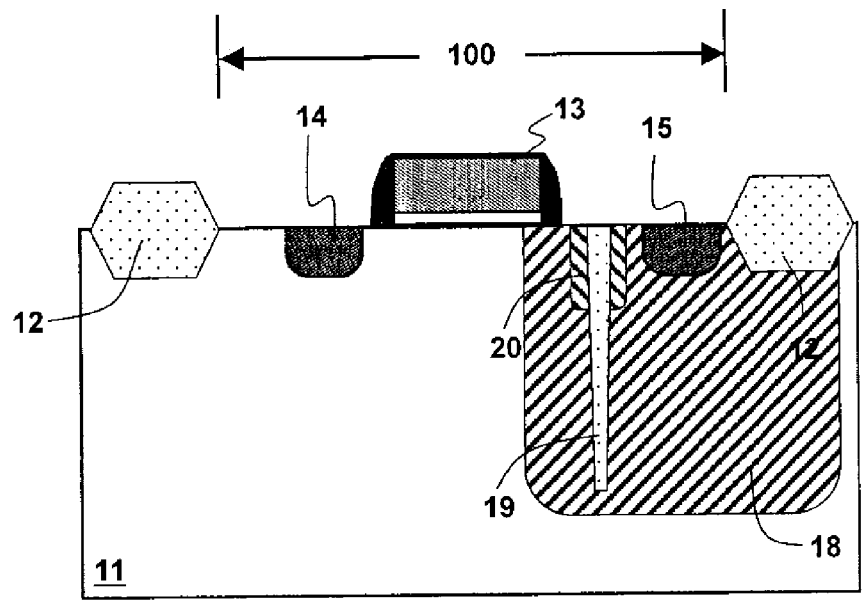
FIG. 5 shows a fourth embodiment of the present invention.

FIG. 5 shows a fourth embodiment of the present invention. This embodiment is similar to the third embodiment, but it is applied to another type of high voltage device, which is a double diffused drain metal oxide semiconductor (DDDMOS) device. The figure shows its cross-section view. Different from the third embodiment, in the DDDMOS device of this embodiment, there is no isolation region 12 beneath the gate 13. The isolation region 12 for example may be formed by LOCOS or STI.

Figure 6A:
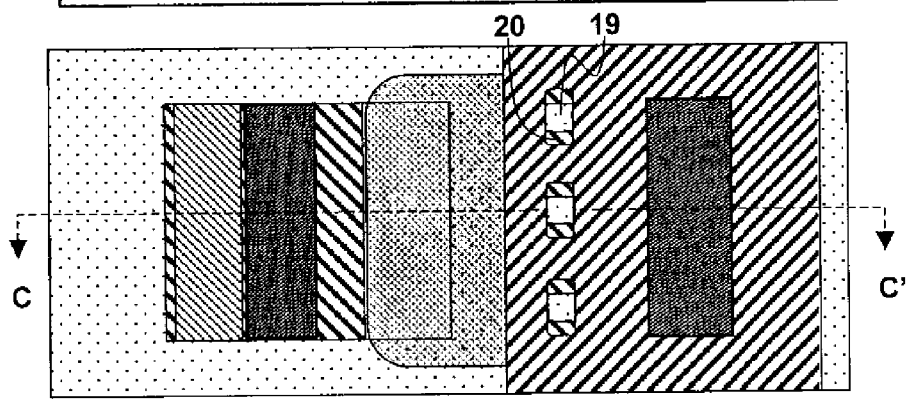
FIGS. 6A and 6B show a fifth embodiment of the present invention.
Figure 6B:
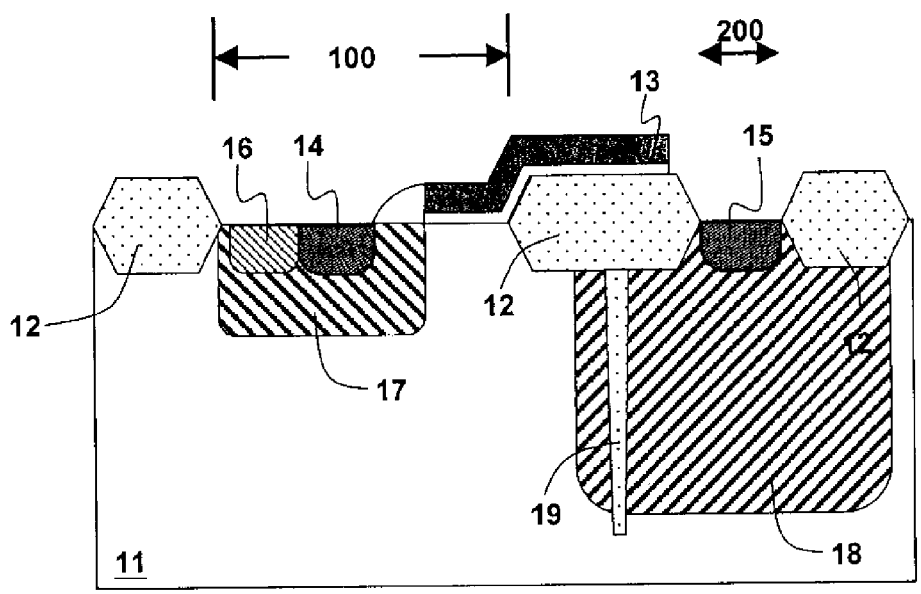

FIGS. 6A and 6B show a fifth embodiment of the present invention. FIG. 6A is a top view of this embodiment, and FIG. 6B is a schematic diagram showing a cross-section view along the cross-section line CC' in FIG. 6A. Different from the first embodiment, the first surrounding region 20 in this embodiment does not completely surround the corresponding segment of the first deep trench isolation structure 19; the first surrounding region 20 includes two parts respectively located at the upper and lower sides (from top view) of the corresponding segment of the first deep trench isolation structure 19, or described in a different way, the first surrounding region 20 is partially around the first deep trench isolation structure 19. Note that the first surrounding region 20 may be of any shape and is not limited to a rectangular shape as shown in the aforementioned embodiments.

Figure 7A:
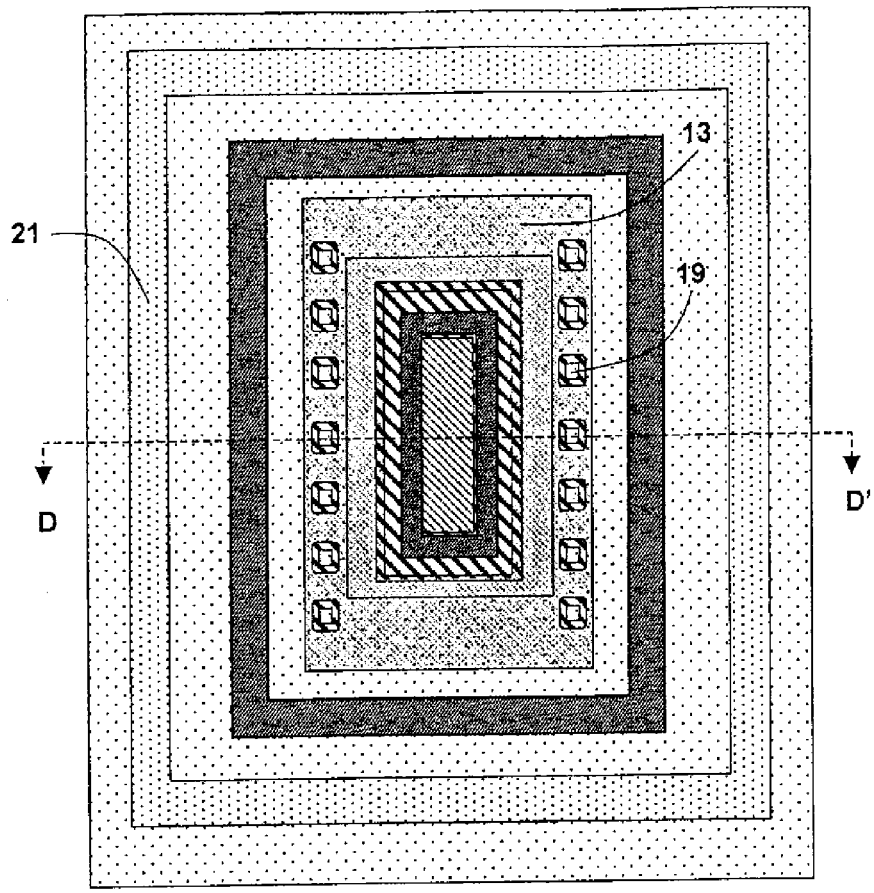
FIGS. 7A and 7B show a sixth embodiment of the present invention.
Figure 7B:
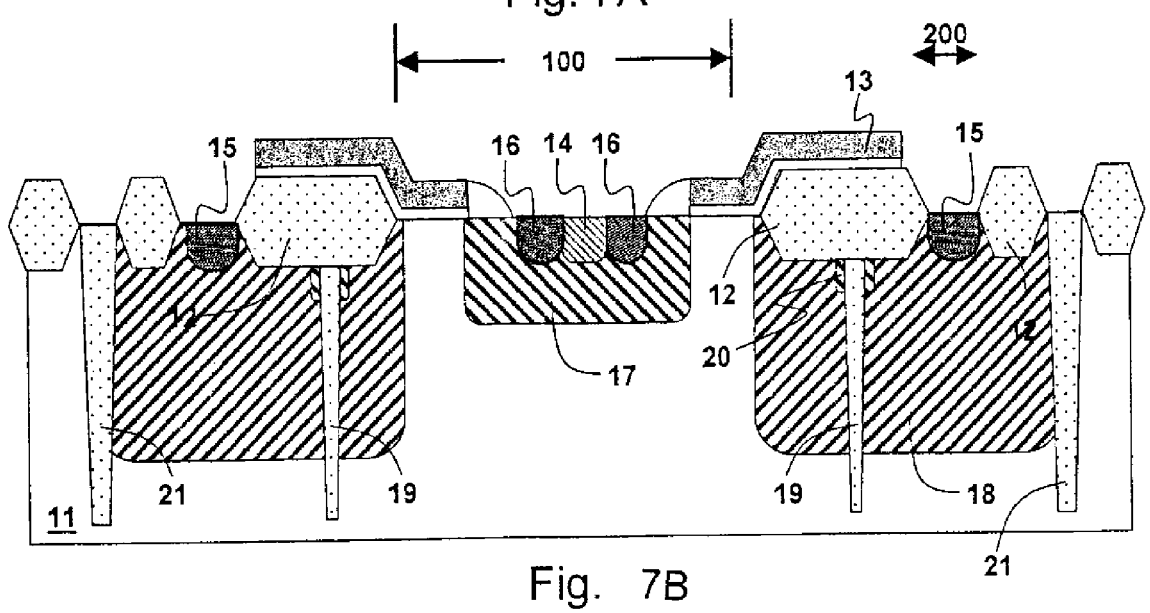

FIGS. 7A and 7B show a sixth embodiment of the present invention. FIG. 7A is a top view of this embodiment, and FIG. 7B is a schematic diagram showing a cross-section view along the cross-section line DD' in FIG. 7A. This embodiment is different from the second embodiment in that the gate 13 is ring-shaped. Besides, in this embodiment, a second deep trench isolation structure 21 is formed outside and surrounding the device regions 100 and 200. In manufacture, the second deep trench isolation structure 21 may be formed by the same process steps as the first deep trench isolation structure 19, so it does not need extra process steps and the manufacturing cost is not increased.

Figure 8A:
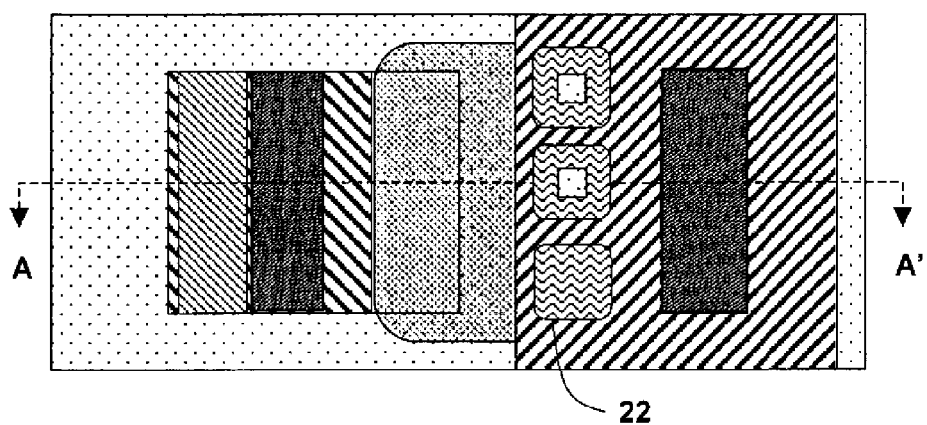
FIGS. 8A and 8B show a seventh embodiment of the present invention.
Figure 8B:
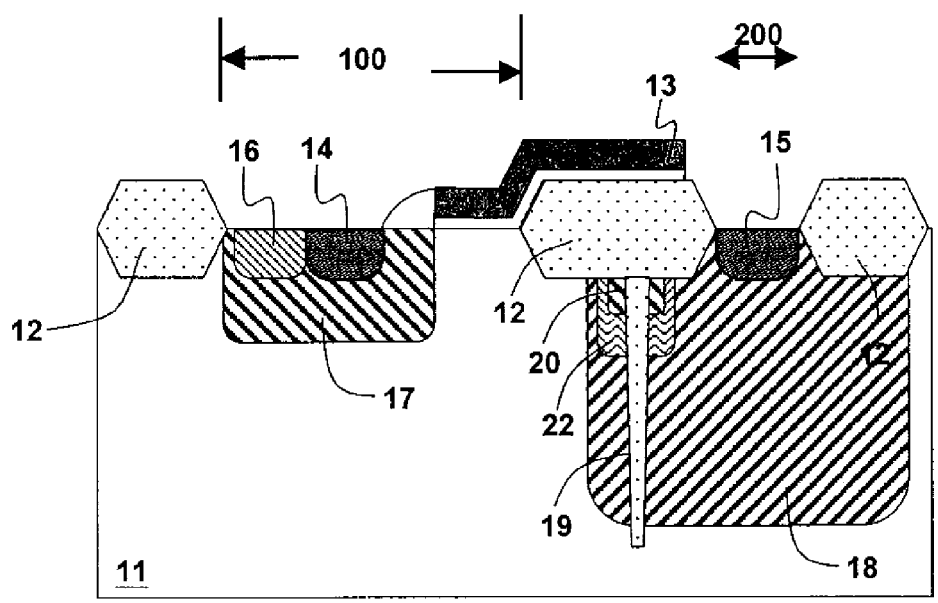

FIGS. 8A and 8B show a seventh embodiment of the present invention. This embodiment is different from the first embodiment in that, a second surrounding region 21 doped with second conductive type impurities is formed outside a corresponding one of the first surrounding regions 20. The second surrounding region 21 may completely surround the corresponding first surrounding region from top view (as shown in the figure), or, the second surrounding region 21 may be partially around the first surrounding region 20 from top view (for example, the second surrounding region 21 may be provided at the upper side, lower side, or both upper and lower sides of the corresponding first surrounding region 20 from top view). The second surrounding region 21 has a depth shallower than the second conductive type well 18.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography step described in the above can be replaced by electron beam lithography, X-ray lithography, etc. For yet another example, the present invention can be applied to symmetric high voltage devices, wherein structures such as the second conductive type well 18, the first deep trench isolation structure 19, the first surrounding region 20, and the second surrounding region 21, etc. are symmetrically provided. For another example, in th manufacturing process described above, many of the process steps are interchangeable as long as proper consideration is taken such as the thermal budget, etc. In view of the foregoing, the spirit of the present invention should cover all such and other modifications and variations, which should be interpreted to fall within the scope of the following claims and their equivalents.

What is claimed is:

1. A high voltage device, comprising:
   a first conductive type substrate in which isolation regions are formed for defining a device region;
   a gate which is formed on the first conductive type substrate;
   a source and a drain, which are formed in the device region and located at both sides of the gate respectively, and are doped with second conductive type impurities;
   a second conductive type well, which is formed in the first conductive type substrate, and surrounds the drain from top view;
   at least a first deep trench isolation structure, which is formed in the first conductive type substrate, and is located in the second conductive type well between the source and the drain from top view, wherein the first deep trench isolation structure has a depth deeper than the second conductive type well from cross-section view; and
   a first surrounding region, which is doped with first conductive type impurities, and completely surrounds the first deep trench isolation structure from top view, the first surrounding region being shallower than the second conductive type well from cross-section view.

2. The device of claim 1, further comprising a body region, which surrounds the source from top view and cross-section view.

3. The device of claim 1, wherein one of the isolation regions is at least partially beneath the gate from cross-section view.

4. The device of claim 1, further comprising a second deep trench isolation structure, which is formed outside and surrounding the device region.

5. The device of claim 1, further comprising a second surrounding region, which is doped with second conductive type impurities, and completely or partially surrounds the first surrounding region from top view, the second surrounding region being shallower than the second conductive type well from cross-section view.

\* \* \* \* \*